US008849643B2

(12) United States Patent
Joshi et al.

(10) Patent No.: US 8,849,643 B2
(45) Date of Patent: Sep. 30, 2014

(54) TABLE-LOOKUP-BASED MODELS FOR YIELD ANALYSIS ACCELERATION

(75) Inventors: Rajiv V. Joshi, Yorktown Heights, NY (US); Rouwaida N. Kanj, Round Rock, TX (US); Keunwoo Kim, Somers, NY (US); Tong Li, Pine Brook, NJ (US)

(73) Assignee: International Business Machines Corporation, Armonk, NY (US)

( * ) Notice: Subject to any disclaimer, the term of this patent is extended or adjusted under 35 U.S.C. 154(b) by 628 days.

(21) Appl. No.: 13/107,355

(22) Filed: May 13, 2011

(65) Prior Publication Data

US 2012/0290281 A1    Nov. 15, 2012

(51) Int. Cl.
*G06F 17/50* (2006.01)

(52) U.S. Cl.
CPC ........ *G06F 17/5022* (2013.01); *G06F 17/5036* (2013.01)
USPC .......................................................... 703/14

(58) Field of Classification Search
None
See application file for complete search history.

(56) References Cited

U.S. PATENT DOCUMENTS

| | | | | | |
|---|---|---|---|---|---|
| 5,467,291 | A | * | 11/1995 | Fan et al. | 703/14 |
| 7,933,747 | B2 | * | 4/2011 | Ma et al. | 703/2 |
| 8,606,557 | B2 | * | 12/2013 | Joshi et al. | 703/13 |
| 2004/0044510 | A1 | * | 3/2004 | Zolotov et al. | 703/14 |
| 2005/0134359 | A1 | * | 6/2005 | Lopez et al. | 327/434 |
| 2008/0077376 | A1 | | 3/2008 | Belhaddad | |
| 2010/0121474 | A1 | | 5/2010 | Bomholt | |

OTHER PUBLICATIONS

Sheu et al., "BSIM: Berkeley Short-Channel IGFET Model for MOS Transistors", IEEE Journal of Solid-State Circuits, vol. 22, Issue 4, Aug. 1987, pp. 558-566.*
Trivedi et al., "Physics-Based Compact Modeling for Nonclassical CMOS", Proceedings of the 2005 IEEE/ACM International Conference on Computer-Aided Design, 2005, pp. 211-216.*
Tiramala et al., "Bringing Manufacturing into Design via Process-Dependent Spice Models", 7th International Symposium on Quality Electronic Design, 2006. ISQED '06., pp. 6 pp.-806 pp.
Mahotin et al., "Process Aware Hybrid SPICE Models Based on TCAD and Silicon Data", 2007 NSTI Nanotechnology Conference and Trade Show—NSTI Nanotech 2007, Aug. 30, 2007.
Mahotin, "TCAD-Based Process-Aware HSPICE Model Parameter Extraction", 2006 NSTI Nanotechnology Conference and Trade Show—NSTI Nanotech 2006 Technical Proceedings, Dec. 13, 2006.
Xi-Wei Lin, "Design for Manufacturing With Increasing Variability", 6th International Conference on ASIC, 2005. ASICON 2005, vol. 1, pp. 1175-1179.
Rodriquez et al., "ESD Circuit Synthesis and Analysis Using TCAD and SPICE", Electron Devices Meeting, 1998. IEDM '98 Technical Digest., International, Dec. 6-9, 1998, on pp. 97-100.
Burenkov et al., "Pre-Silicon SPICE Modeling of Nano-Scaled SOI MOSFETs", 9th International Conference on Ultimate Integration of Silicon, 2008. ULIS 2008., pp. 215-218.
Xuewen et al., "A TCAD tool of DOE combining with simulation for IC optimization design", Acta Scientiarum Naturalium Universitatis Pekinensis, vol. 38 , No. 5 , p. 713-18, 2002.

* cited by examiner

*Primary Examiner* — Omar Fernandez Rivas
*Assistant Examiner* — Herng-Der Day
(74) *Attorney, Agent, or Firm* — Preston Young

(57) ABSTRACT

In one embodiment, the invention is a method and apparatus for table-lookup-based models for yield analysis acceleration. One embodiment of a method for statistically evaluating a design of an integrated circuit includes simulating the integrated circuit and generating a lookup table for use in the simulating, the lookup table comprising one or more blocks that specify a device element for an associated bias voltage, wherein the generating comprises generating only those of the one or more blocks that specify the device element for a bias voltage that is required during the simulating.

20 Claims, 6 Drawing Sheets

TABLE-LOOKUP-BASED MODELS FOR YIELD ANALYSIS ACCELERATION

BACKGROUND OF THE INVENTION

The present invention relates generally to design automation, and relates more particularly to statistical simulation of memory and logic designs.

With deep technology scaling, statistical simulations play a key role in the analysis of state of the art memory and logic designs. Threshold voltage variation due to random dopant fluctuation, stress, bias temperature instability (BTI) variations, and telegraphic noise, along with other sources of process variation (e.g., mobility, oxide thickness, device length, width variations, and the like), can all affect the design yield. For instance, threshold voltage mismatch often causes stability, functionality, and performance degradation in memory designs under fail probabilities of less than one part per million.

Various techniques including Monte Carlo techniques or fast Monte Carlo methods are used to analyze the statistical behavior of designs. To speed up the statistical simulations, fast simulators and current source models can replace traditional simulation programs with integrated circuit emphasis (SPICE) simulators. Statistical simulations for yield analysis purposes (especially when dealing with rare fail events of memory designs), however, invoke many device instances (devices also span a large variability space) and require extreme accuracy; hence, the model pre-tabulation costs can be high, and reliance on early Berkeley short-channel insulated gate field effect transistor (IGFET) models (BSIMs) may prove inaccurate. This is especially true during the design optimization cycle, when multiple cell design choices may be under consideration.

SUMMARY OF THE INVENTION

In one embodiment, the invention is a method and apparatus for table-lookup-based models for yield analysis acceleration. One embodiment of a method for statistically evaluating a design of an integrated circuit (e.g., a memory or logic design) includes simulating the integrated circuit and generating a lookup table for use in the simulating, the lookup table comprising one or more blocks that specify a device element for an associated bias voltage, wherein the generating comprises generating only those of the one or more blocks that specify the device element for a bias voltage that is required during the simulating.

In another embodiment, a method for statistically evaluating a design of an integrated circuit includes building these blocks that specify the device elements that are called by a conventional simulator model from a more accurate model that is generated on-the-fly (for example, by replacing the conventional calls to a BSIM evaluation with calls to a technology computer-aided design (TCAD) evaluation of the model at a given bias voltage).

In another embodiment, a method for statistically evaluating a design of an integrated circuit includes simulating the integrated circuit and computing a channel current for a bias point in the integrated circuit, wherein the computing utilizes a single spline evaluation while accounting for variability.

The above-described features enable an on-demand local block table approach that allows for more reliable model resources, faster simulators, and more room for variability modeling.

BRIEF DESCRIPTION OF THE DRAWINGS

So that the manner in which the above recited features of the present invention can be understood in detail, a more particular description of the invention may be had by reference to embodiments, some of which are illustrated in the appended drawings. It is to be noted, however, that the appended drawings illustrate only typical embodiments of this invention and are therefore not to be considered limiting of its scope, for the invention may admit to other equally effective embodiments.

DETAILED DESCRIPTION

In one embodiment, the present invention is a method and apparatus for table-lookup-based models for yield analysis acceleration. In particular, embodiments of the present invention employ on-demand, lookup table based simulations for statistical applications. The adaptive, transient simulation-based lookup tables are generated on-demand, as needed during the simulator's model evaluation calls to the transistor models; these lookup tables are then reused during the same sample or in subsequent sample simulations. Knowing the nature of the dynamic margin analysis that is typically adopted for the purposes of statistical simulation allows the sizes of the lookup tables to be reduced. The reduced lookup table size, in turn, allows embodiments of the present invention to achieve more accurate modeling of process variations over a wider range of variability. Finally, conventional threshold voltage ($V_T$) table interpolation is replaced by a gate voltage ($V_G$) offset technique that improves efficiency by modeling the behavior of a device based on only one reference threshold voltage (as opposed to two). Some embodiments of the invention also reduce the computation costs associated with spline evaluations for given bias points.

Embodiments of the present invention are described within the exemplary context of BSIM simulations. However, the present invention is equally applicable to other types of simulations, including surface-potential (PSP) based MOSFET model simulations, among others. Hence, it is assumed in some embodiments that a conventional SPICE simulator calls the BSIM model to evaluate certain device elements at given bias points. Embodiments of the invention can build tables of the device element values at certain blocks specific to the transient simulation bias points and reuse some of these values during the same sample simulation (or subsequent sample simulations). The values can then be generated from more accurate sources, like TCAD, based on direct current analysis.

Within the context of the present invention, a "device element" may be any one or more of a current element (e.g., bulk-drain diode current $I_{BD}$, input bias current $I_{BS}$, gate-bulk current $I_{GB}$, gate drive output current $I_{GD}$, gate-source current $I_{GS}$, or channel current $I_{DS}$), a charge element (e.g., gate-bulk charge $Q_{GB}$, source-bulk charge $Q_{SB}$, drain-bulk charge $Q_{DB}$, or base-internal base charge $Q_{BX}$), a thermal capacitance $C_{TH}$, thermal current $I_{TH}$, or thermal resistance $R_{TH}$, among other device elements. Although embodiments of the invention are discussed below within the exemplary context of channel current, the described methods are equally applicable to other types of device elements including those listed above.

Figure 1:
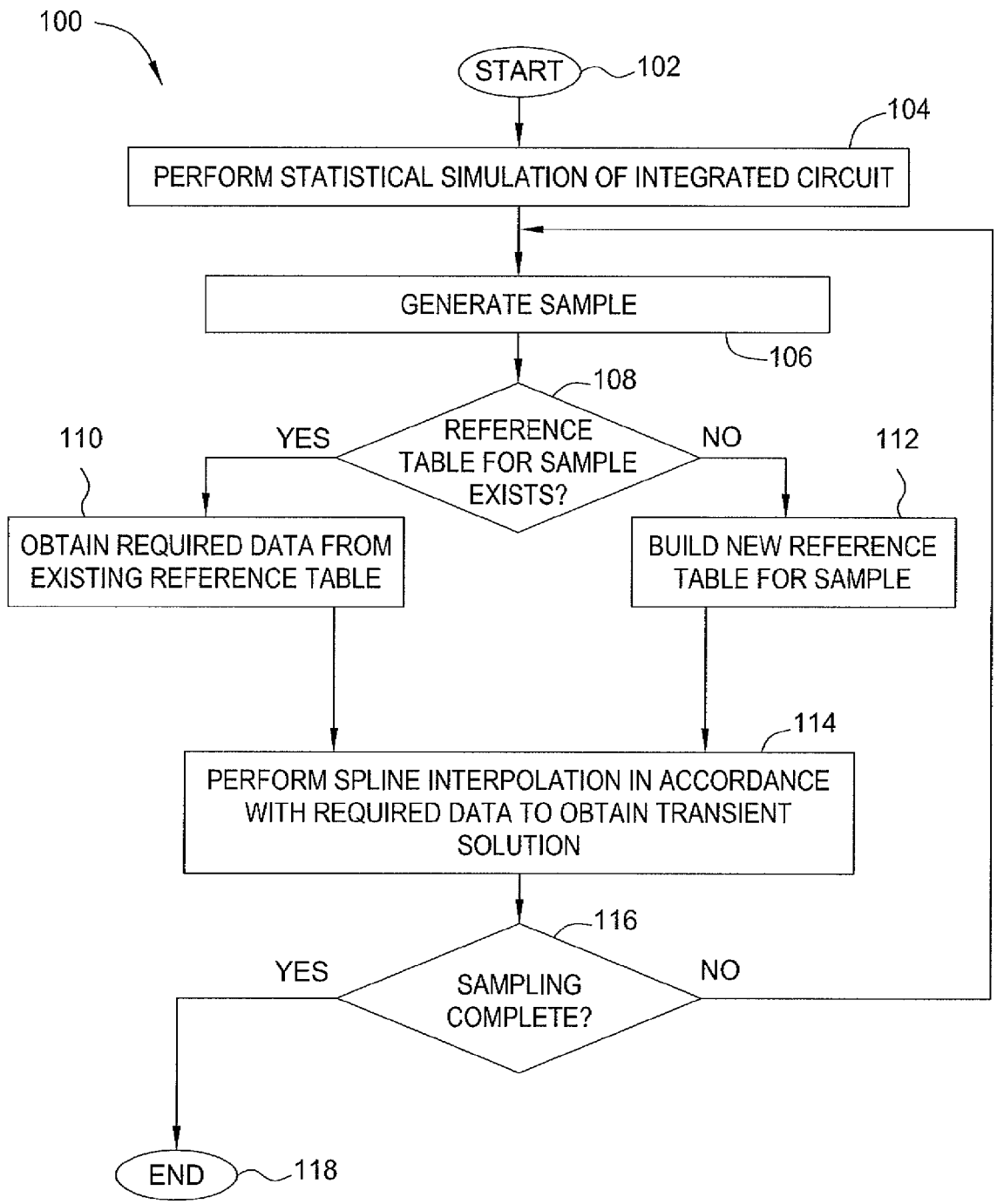
FIG. 1 is a flow diagram illustrating one embodiment of a method for statistical simulation-based analysis of an integrated circuit, according to the present invention.

FIG. 1, for example, is a flow diagram illustrating one embodiment of a method 100 for statistical simulation-based analysis of an integrated circuit, according to the present invention. The method 100 may be implemented, for example, during simulation using a SPICE or SPICE-like simulator (although use of other simulators is contemplated).

The method 100 is initialized in step 102 and proceeds to step 104, where statistical simulation of the integrated circuit is performed. In one embodiment, the statistical simulation is performed using a BSIM-based simulator, a SPICE-based simulator, a TCAD-based simulator, or a PSP-based simulator.

In step 106, a sample is generated based on the statistical distributions. For example, the memory cell device threshold voltages may be varied randomly according to their individual standard deviations. A random sample corresponds to a given threshold voltage combination as defined in the variability space.

In step 108, it is determined whether reference tables corresponding to the devices generated from the sample point exist. A reference table may contain, for example, model evaluation parameters that are used in nodal equations (such as current, charge, cap and resistor values, and derivatives thereof versus bias voltages). The reference table would be as close as possible to the sample point values in terms of the variability characteristics of the device and can be used to extrapolate (or interpolate) the device behaviors (e.g., device element values at different bias conditions) for the sample point.

Figure 2:
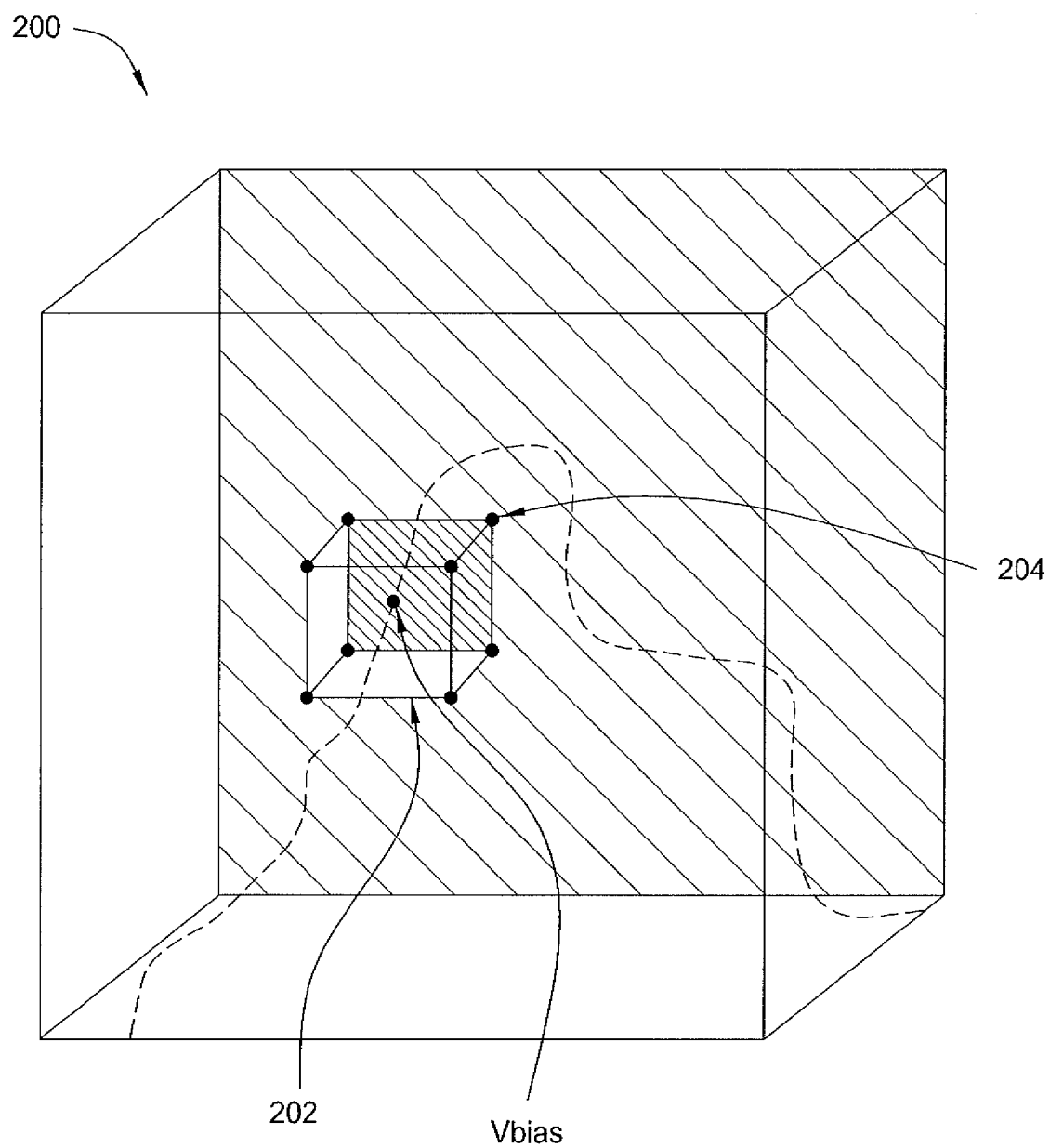
FIG. 2 illustrates an exemplary lookup table local block for use in statistical evaluation of an integrated circuit.

If a reference table already exists, then the required data can be obtained from the reference table in step 110 (e.g., according to the methods discussed in conjunction with FIGS. 2-3, below). Alternatively, if a reference table does not exist, then a new reference table is build for the sample in step 112, and the required data is then obtained from the new reference table. In one embodiment, a TCAD model is called to build blocks of the new reference table (e.g., according to the methods discussed in conjunction with FIGS. 2-3, below).

In step 114, a spline interpolation is performed in accordance with the data obtained in step 110 or step 112. One method for performing this spline interpolation is described in greater detail in connection with FIG. 3.

Once the transient solution has been obtained using the spline interpolation, it is determined in step 116 whether the sampling is complete. If the sampling is not complete, then the method 100 returns to step 106, and a new sample is generated.

Alternatively, if the sampling is complete, then the method 100 terminates in step 118.

Thus, using the approach detailed in FIG. 1, a relatively small number of reference tables can represent many sample points, and the building blocks of these tables can be reused among the sample points for the statistical dynamic margin analysis. The number of blocks is relatively small because the reference tables are restricted to a dynamic margin study. Furthermore, the reduced size of the blocks (and hence, the reference tables) allows device elements to be modeled while accounting for variability from more reliable resources (like TCAD-based element evaluation).

As discussed above, one embodiment of the invention models threshold voltage ($V_T$) variation using a gate voltage ($V_G$) offset. Evaluation with respect to the reference tables discussed above using a gate voltage offset technique allows a transient solution to be obtained in a single spline evaluation (i.e., the above-mentioned interpolation) rather than in the two or more spline evaluations that are typically necessary.

In particular, threshold voltage variation in devices is emulated by offsetting the gate voltage of the nominal threshold voltage device. This approach is supported by the fact that the drain current ($I_{DS}$) of a device is a function of voltage overdrive (gate to source voltage minus threshold voltage, or $V_{GS}-V_T$) and not of $V_{GS}$ and $V_T$ separately. To a first order, the drain-to-source current $I_D$ of a metal-oxide-semiconductor (MOS) device can be expressed as:

$$I_D = \begin{cases} I_0 \frac{W}{L} e^{\frac{V_{GS}-V_T}{S_S}} \left(1 - e^{\frac{-V_{DS}}{kT/q}}\right) & V_{GS} < V_T \quad \text{(Cut off)} \\ k\frac{W}{L}\left((V_{GS}-V_T)V_{DS} - \frac{V_{DS}^2}{2}\right) & V_D < V_{DSAT} \quad \text{(Linear)} \\ k\frac{W}{L}(V_{GS}-V_T)^\alpha(1+\lambda V_{DS}) & V_D > V_{DSAT} \quad \text{(Saturation)} \end{cases} \quad \text{(EQN. 1)}$$

where $V_{DS}$ is the drain to source voltage, $V_{DSAT}$ is the drain saturation voltage, W is the width of the device, L is the length of the channel, and k, $\alpha$, and $\lambda$ are model constants.

In EQN. 1, the $V_{GS}$ and $V_T$ terms always appear as the expression ($V_{GS}-V_T$). This is fundamental to device physics and also is valid for more advanced device models that include various short channel effects. Thus, if one were to simulate a device in which $V_T-V_{T,nom}-\Delta V_T$, one can predict the behavior of the modified $V_T$ device by applying a constant $V_{GS}$ offset of $\Delta V_T$ in the nominal device model table. The offset $\Delta V_T$ in gate voltage replicates the effect of $V_T$ variation on device performance by affecting voltage overdrive ($V_{GS}-V_T$) in the same way as equivalent $V_T$ variation. The modified device characteristics for a given $V_T$ variation can therefore be obtained from the device characteristics of the nominal device in the following manner:

$$I_{DS}(V_{T,nom})=f(V_{GS},V_{DS}) \Rightarrow I_{DS}(V_{T,nom}-\Delta V_T)=f(V_{GS}+V_T,V_{DS}) \quad \text{(EQN. 2)}$$

Where, for devices whose sources are not grounded, the bias can be applied to $V_G$ (rather than to $V_{GS}$).

In a further embodiment, the $V_{GS}$ offset technique is used to estimate the impact of $V_T$ variation on various field effect transistor (FET) capacitances. In this case, the drain currents ($I_{DS}$) and gate to source capacitance ($C_{GS}$) responses for each device under consideration. In one embodiment, the devices under consideration have threshold variations in the range of ±100 mV. The $I_{DS}$ and $C_{GS}$ behavior for these devices are then predicted by applying an appropriate $V_{GS}$ bias to the nominal $V_T$ device model. In one embodiment, a table is maintained for device instances with threshold voltage increments of or smaller than a given value (e.g., 50 mV). A $V_G$ offset can then be used to predict device characteristics for intermediate threshold voltage values (e.g., offsets smaller than the given value). For example, the characteristics for a device characterized by $\Delta V_T$=60 mV can be derived from the characteristics of a device characterized by $V_T$=50 mV using a $V_G$ offset of 10 mV.

As discussed above, embodiments of the invention employ on-demand, lookup table based simulations for statistical applications. Traditional simulators, including SPICE simulators, apply multi-step integration with linearization to solve the transient response of a device design. For each device, given all of the bias voltages for the device, the simulator needs to call the device evaluation routing during simulation to obtain the value(s) and/or the derivative(s) of the value(s) versus all of the bias voltages at the current bias condition. BSIM models are widely used in circuit simulation for evaluating of MOSFET devices.

BSIM model evaluation, however, tends to rely on complex empirical equations and may not be accurate due to the complexity of the models. Embodiments of the invention therefore use lookup tables to represent complex BSIM models and possibly rely on more reliable sources. FIG. 2, for example, illustrates an exemplary lookup table local block 200 for use in statistical evaluation of an integrated circuit.

Taking channel current $I_{DS}$ as an example, where $I_{DS}$=f ($V_{GB}$, $V_{DB}$, $V_{SB}$) (and where $V_{GB}$ represents back gate voltage, $V_{DB}$ is represents drain breakdown voltage, and $V_{SB}$ represents stand by voltage), $V_{GB}$, $V_{DB}$, and $V_{SB}$ are all assumed to be $\in$[-Vmax, +Vmax] (Vmax>0) during circuit simulation. This forms a cubic that covers the bias voltage ($V_{GB}$, $V_{DB}$, $V_{SB}$) from (-Vmax to +Vmax). Each bias voltage dimension can be split into n evenly sized intervals in the lookup table, and the whole cubic can then be split into $n^3$ cubic blocks 202 (hereinafter referred to as "cubics" or "blocks"). The vertices 204 of these small blocks 202 are referred to herein as "grid points." Channel current data at the grid points 204 is obtained by calling the BSIM evaluation function (or an equivalent evaluation function). For any bias points that do not fall on a grid point 204, interpolation techniques are used to provide a channel current value and its derivatives. In one embodiment of the present invention, interpolation is performed in accordance with a spline function.

In one embodiment, a lookup table model such as that described above is generated in an adaptive manner. Specifically, the lookup table model is created only for the blocks that are needed during direct current/transient simulation (i.e., rather than creating a lookup table model that covers all blocks from -Vmax to +Vmax). Thus, the lookup table is created on-demand. This reduces the time and storage required to generate and maintain a complete lookup table model full of small blocks, many of which will not even be needed during simulation. While this offers savings even if the table is populated using BSIM, in other embodiments, more reliable sources are relied upon to populate the same device elements (and hence improve the accuracy of the SPICE simulator).

Figure 3:
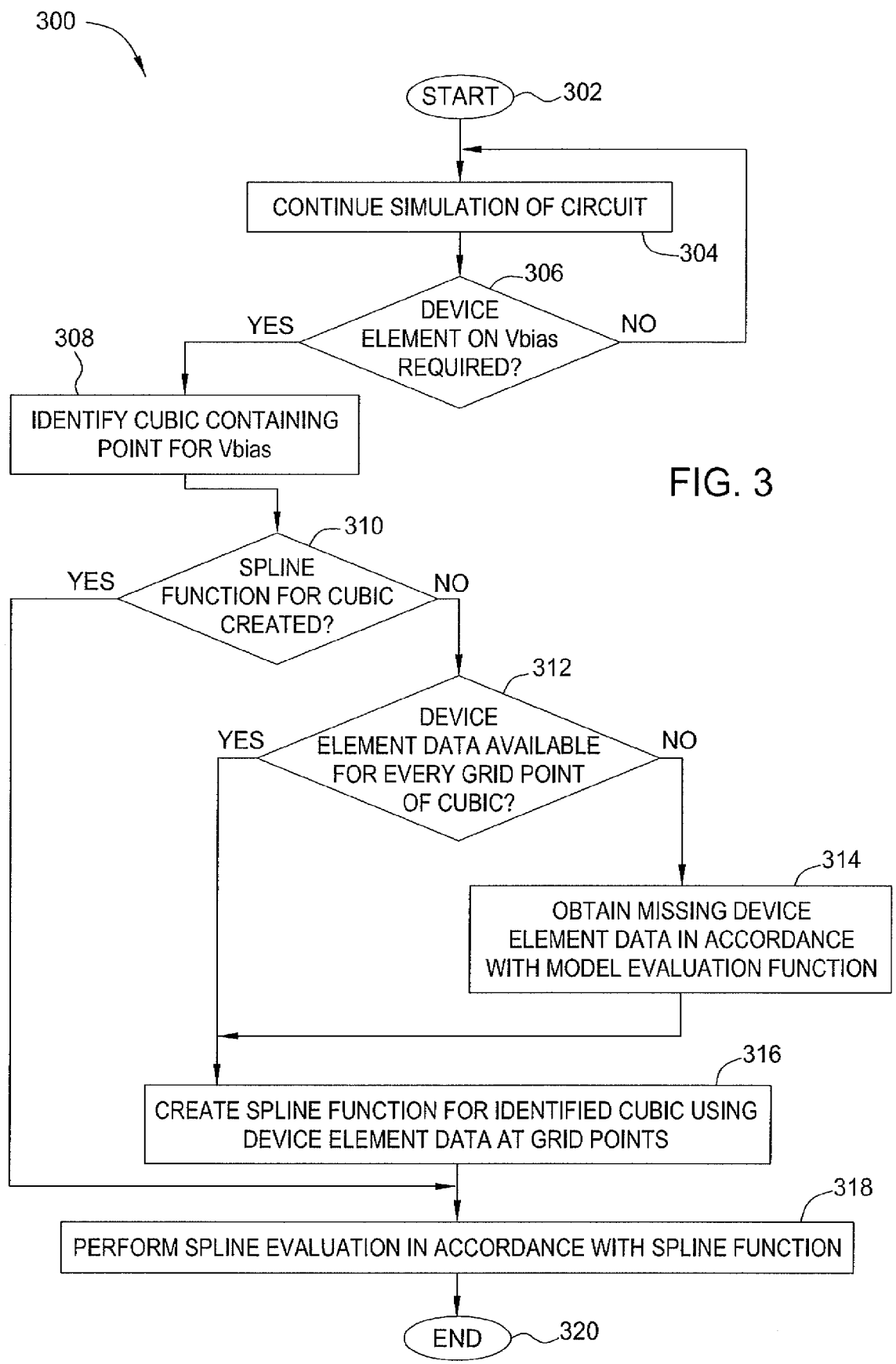
FIG. 3 is a flow diagram illustrating one embodiment of a method for performing a spline interpolation, according to the present invention.

FIG. 3 is a flow diagram illustrating one embodiment of a method 300 for performing a spline interpolation, according to the present invention. The method 300 may be implemented, for example, in accordance with step 114 of the method 100, discussed above.

The method begins in step 302 and proceeds to step 304, where simulation of the integrated circuit (e.g., in accordance with SPICE or another simulator) continues as discussed above with respect to FIG. 1.

In step 306, it is determined whether the simulator requires a device element or a derivative of a device element on any bias voltage ($V_{GB}$, $V_{DB}$, $V_{SB}$), generally indicated by Vbias. If it is determined in step 306 that no device element or derivative of the channel device element is required by the simulator, then the method 300 returns to step 304, and the simulation proceeds as usual.

Alternatively, if it is determined in step 306 that the channel current device element or a derivative of the device element is required on a given bias voltage Vbias, then the cubic (block in the grid) that contains the point for the given bias voltage Vbias is identified in step 308.

In step 310, it is determined whether a spline function has been created for the identified cubic. If it is determined in step 310 that a spline function for the identified cubic has been created, then the method proceeds to step 318 where the spline evaluation (i.e., calculation of the device element or the derivative of the device element) is performed using the spline function for the identified cubic.

Alternatively, if it is determined in step 310 that no spline function has been created for the identified cubic, then a spline function will need to be created and saved for later user. Thus, the method next proceeds to step 312, where each grid point of the cubic is analyzed to determine whether device element information is available.

If it is determined in step 312 that the device element information is not available for any grid points of the identified cubic, then the method 300 proceeds to step 314, where the missing device element data is obtained. In one embodiment, the missing device element data is obtained by replacing the model evaluation function (e.g., a BSIM model evaluation function) with more accurate TCAD simulations or other reliable, accurate models including hardware-based physical models and well-calibrated target models for bulk silicon-on-insulator (SOI), planer, non-planar, and other types of devices. In another embodiment, step 314 relies on the BSIM models in the advanced stage.

In step 316, the device element information at all grid points of the identified cubic is used to create the spline function for the identified cubic. Note that if it is determined in step 312 that the device element information is available for all of grid points of the identified cubic, then the method 300 may proceed directly from step 312 to step 316 (i.e., bypassing step 314).

After the spline function is created in step 316, the method 300 proceeds to step 318 and performs the spline evaluation using the spline function, as described above. Once the spline evaluation has been completed, the method 300 terminates in step 320.

The method 300 is performed for each element of the integrated circuit for which the simulator requires the device element or a derivative of the device element on any bias voltage ($V_{GB}$, $V_{DB}$, $V_{SB}$). This approach produces an adaptive lookup table that is created on-demand. Such an approach is especially well-suited for statistical yield analyses. The simulations for a given point require only a few clock cycles (e.g., one to three cycles, typically) in order to study the dynamic margins of the integrated circuit design, and the simulations may be run for several points and supply/bias conditions. Hence, the integrated circuits visit only a small portion of their functionality space, with good reuse potential (which increases with the symmetric nature of, for example a static random access memory (SRAM) cell and the gate voltage offset technique described above). That is, the on-demand, adaptive lookup table can be reused for subsequent evaluations. This is also true for other logic and memory designs (both digital and analog).

The reduced size of the on-demand lookup table accommodates device instance modeling for a wide range of process variation considerations, including the modeling of threshold voltage variation and its effect on yield due to device mismatch. In addition to threshold voltage variation, the above methods can also be applied to model the variation of other process variation parameters, including length, width, oxide thickness, and mobility, among others. In one embodiment, a new lookup table is created on-demand to represent each device instance for each new $\Delta V_T$ sample point value. With hundreds of samples, this can lead to a very large number of lookup tables being generated for the statistical simulation.

Interpolation can be used to reduce the number of required lookup tables. However, interpolation at a given $\Delta V_T$ value will require evaluation of the block elements at two bounding (neighboring) $V_T$ values, which may increase the cost of the model's spline evaluation.

Thus, in a further embodiment, the gate voltage offset technique described above can be used to make the statistical simulation more efficient. In this case, the device characteristics are derived from the nearest $\Delta V_T$ lookup table, along with the proper gate bias. Only one set of block evaluations is needed per bias point for a given sample point. Different $\Delta V_T$ sample points (requiring different gate voltage offsets) can share the same lookup table model if they are based on the same reference $\Delta V_T$ value. In general, the number of required fixed (reference) $\Delta V_T$ instances subject to variability is not large. When the number of device instances subject to variability is large, however, the gate voltage offset technique can be used to model the $\Delta V_T$ variability trends by relying on the nominal (i.e., $\Delta V_T = 0$) lookup table only.

Figure 4:
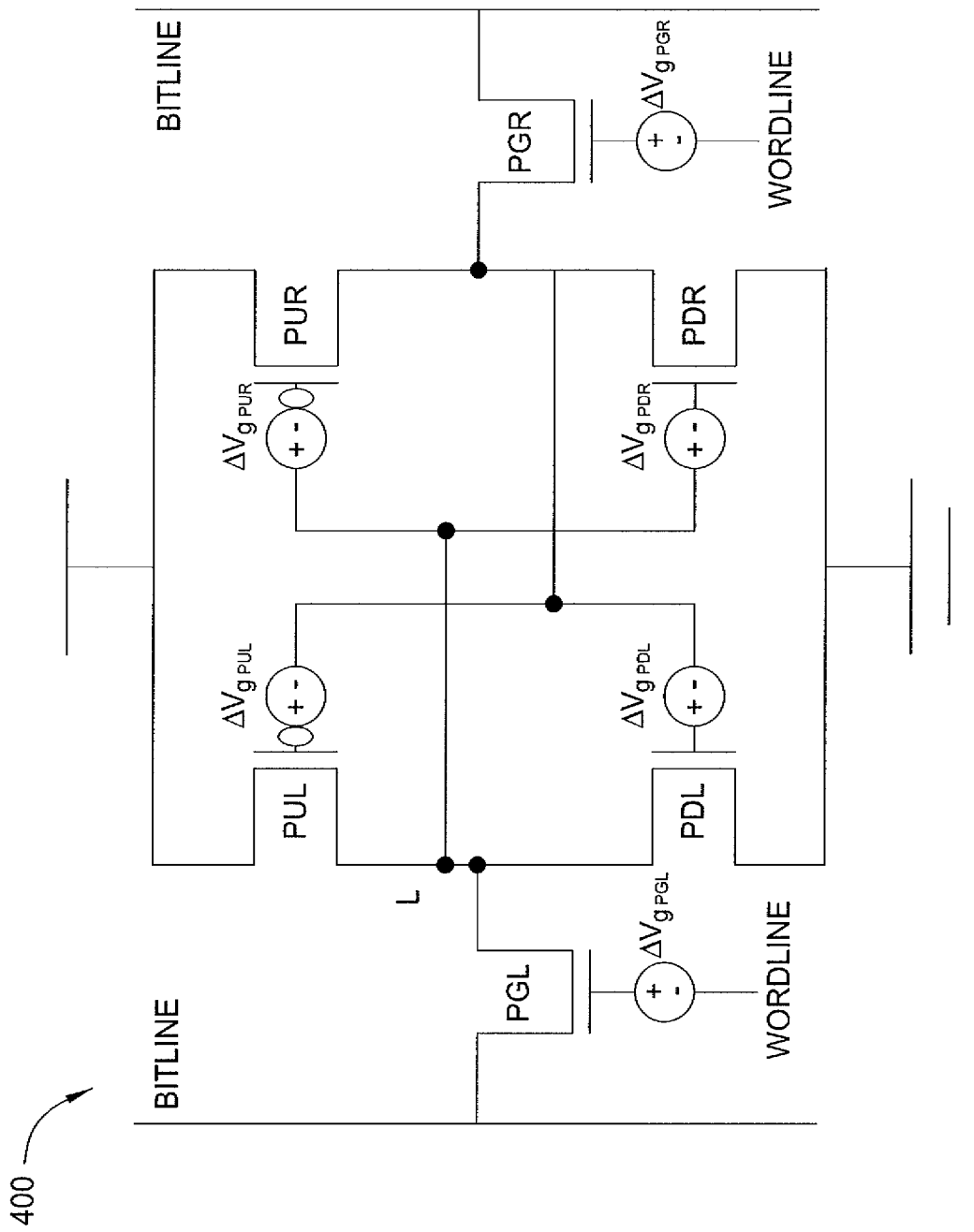
FIG. 4 is a schematic diagram illustrating an exemplary six-transistor static random access memory cell with a modified gate voltage.

Embodiments of the invention may be further applied to model SRAM dynamic margins. FIG. 4, for example, is a schematic diagram illustrating an exemplary six-transistor static random access memory cell 400 with a modified gate voltage. The cell 400 accounts for the gate voltage offset technique described above.

$V_{Tstep}$ is the distance between two fixed $V_T$ variables. For example, for a step of 50 mV, device instance tables are maintained for fixed $\Delta V_T$ ($\Delta V_{Ttable}$) values at 0, ±50 mV, ±100 mV, etc. During simulation, for a given $\Delta V_T$ sample point, the device threshold voltage is set to match the nearest $\Delta V_{Ttable}$ values, and the gate voltage is offset such that the net variation is equivalent to that of the desired sample point value $\Delta V_T$.

For instance, given a sample point $\Delta V_{Ti}$, where $i \in \{PUL, PUR, PDL, PDR, PGL, PGR\}$, $\Delta V_{Ttable-i}$=nearest_integer$(\Delta V_{Ti}/\Delta V_{Tstep})*\Delta V_{Tstep}$, and $\Delta V_{gi}=-1*(\Delta V_{Ti}-\Delta V_{Ttable-i})$. To estimate five sigma design yields with confidence, tables in one embodiment span a wide range of $V_T$ variability.

It has been shown that static noise margins can underestimate the yield of memory designs, especially for silicon-on-insulator (SOI) devices where the hysteretic behavior of the body node can impact the device strength. Hence, the cell dynamic margins are of interest. However, this adds to the complexity of a typical BSIM simulation, as the transient simulations by nature require many more device evaluations (e.g., as opposed to direct current simulations). Two key margins are dynamic stability and writability.

Figure 5:
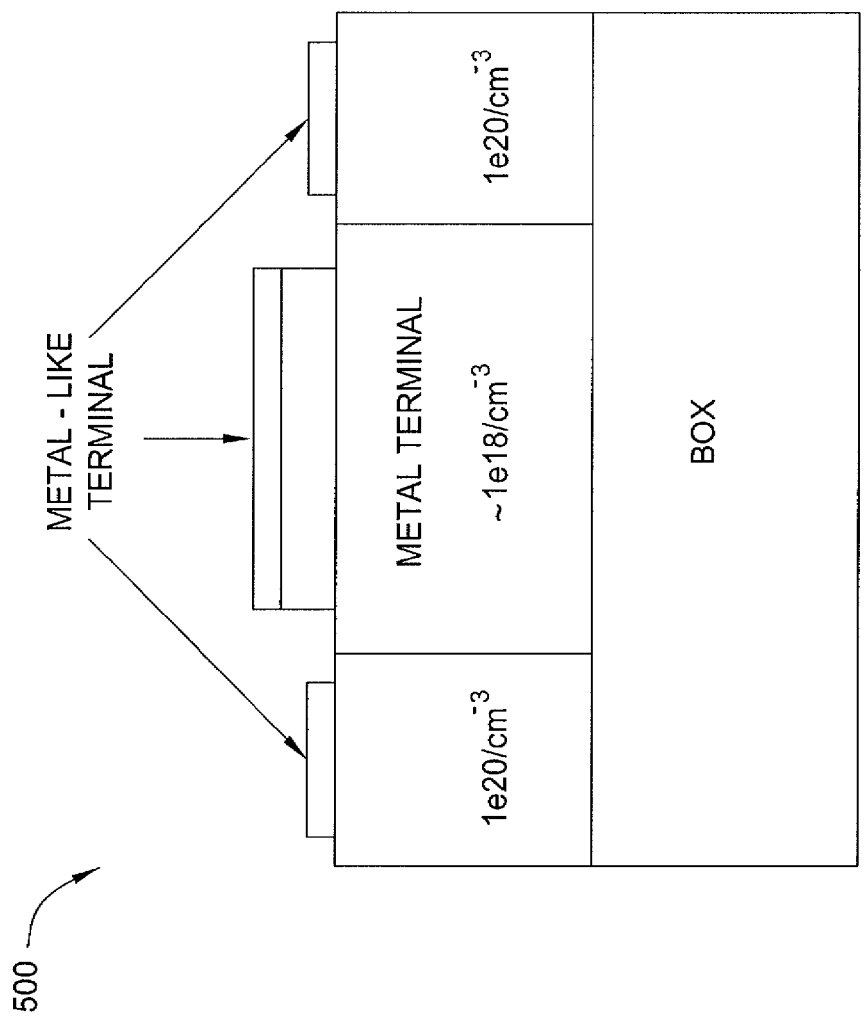
FIG. 5 is a schematic diagram illustrating an exemplary application of the present invention as applied to the context of technology computer aided design table building.

FIG. 5 is a schematic diagram illustrating an exemplary application of the present invention as applied to the context of TCAD table building. In one embodiment of this application, the integrated circuit is a partially depleted SOI (PD-SOI) device. In this case, the goal is to solve for the virtual body voltage $Vb_{virtual}$ ($V_G$, $V_S$, $V_D$), which is a function of structure and bias at ($V_G=0$, $V_S=0$, $V_D=1$). Solving for $Vb_{virtual}$ allows a designer to design for the body contact doping material to be used in the structure of the device 500. Specifically, the bias condition ($V_G$, $V_S$, $V_D$) determines $Vb_{virtual}$, which in turn determines the density of the body, which in turn determines the material to be used for the contact at the bias point.

Once the body electrode material is defined, the designer can build the external body contact and, hence, apply external body voltage for the device structure and derive $I_{DS}$ ($V_G$, $V_S$, $V_D$, Vb).

By solving for the virtual body voltage, one can identify the contact material such that $V_{applied}=Vb$, thereby mimicking the structure in a floating body BSIM device.

If the wrong body electrode material is used, then the abrupt transition of the body and the terminal will create a convergence problem for the TCAD solver. For instance, inaccurate extraction may be obtained due to the Ohmic voltage drop between the body terminal and the actual body. This is not a concern for the source, drain, and gate contacts due to the similar nature of the source and drain regions and the contacts.

Figure 6:
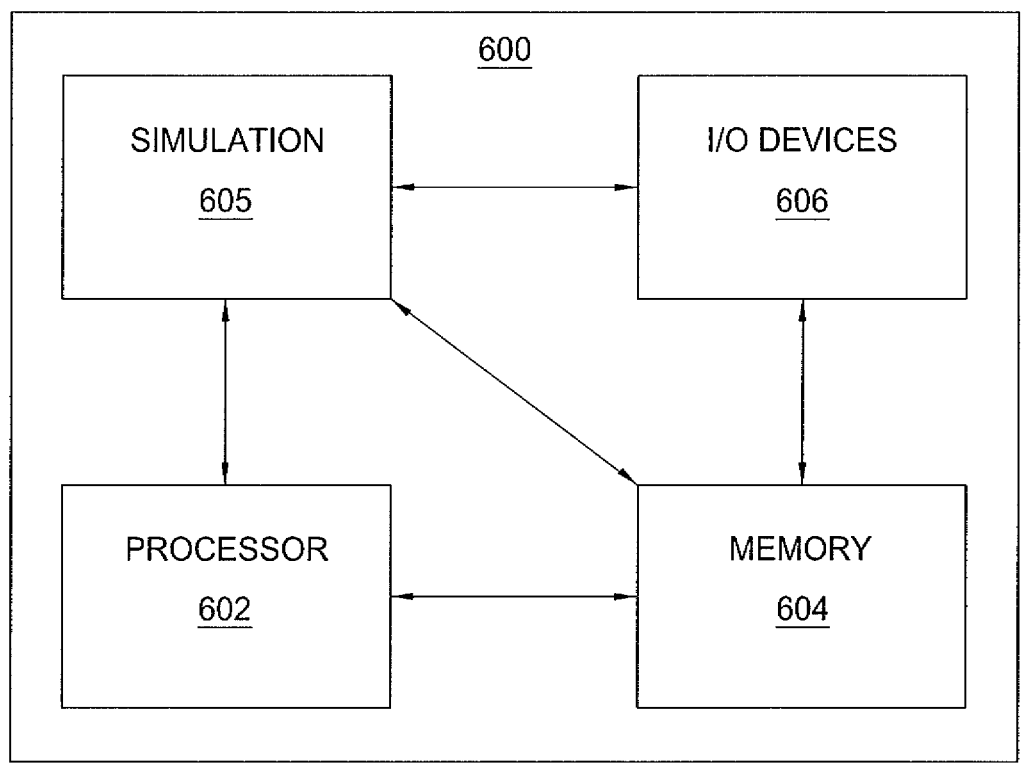
FIG. 6 is a high-level block diagram of statistical evaluation method that is implemented using a general purpose computing device.

FIG. 6 is a high-level block diagram of statistical evaluation method that is implemented using a general purpose computing device 600. In one embodiment, a general purpose computing device 600 comprises a processor 602, a memory 604, a simulator module 605 and various input/output (I/O) devices 606 such as a display, a keyboard, a mouse, a stylus, a wireless network access card, and the like. In one embodiment, at least one I/O device is a storage device (e.g., a disk drive, an optical disk drive, a floppy disk drive, a path selection tool, and/or a test pattern generation tool). It should be understood that the simulator module 605 can be implemented as a physical device or subsystem that is coupled to a processor through a communication channel.

Alternatively, the simulator module 605 can be represented by one or more software applications (or even a combination of software and hardware, e.g., using Application Specific Integrated Circuits (ASIC)), where the software is loaded from a storage medium (e.g., I/O devices 606) and operated by the processor 602 in the memory 604 of the general purpose computing device 600. Thus, in one embodiment, the simulator module 605 for performing a statistical evaluation of an integrated circuit, as described herein with reference to the preceding Figures, can be stored on a computer readable storage device (e.g., RAM, magnetic or optical drive or diskette, and the like).

It should be noted that although not explicitly specified, one or more steps of the methods described herein may include a storing, displaying and/or outputting step as required for a particular application. In other words, any data, records, fields, and/or intermediate results discussed in the methods can be stored, displayed, and/or outputted to another device as required for a particular application. Furthermore, steps or blocks in the accompanying Figures that recite a determining operation or involve a decision, do not necessarily require that both branches of the determining operation be practiced. In other words, one of the branches of the determining operation can be deemed as an optional step.

While the foregoing is directed to embodiments of the present invention, other and further embodiments of the invention may be devised without departing from the basic scope thereof. Various embodiments presented herein, or portions thereof, may be combined to create further embodiments. Furthermore, terms such as top, side, bottom, front, back, and the like are relative or positional terms and are used with respect to the exemplary embodiments illustrated in the figures, and as such these terms may be interchangeable.

What is claimed is:

1. A method for statistically evaluating a design of an integrated circuit, the method comprising:
   simulating the integrated circuit; and
   generating a lookup table for use in the simulating, the lookup table comprising one or more blocks, wherein each of the one or more blocks specifies a device element for an associated bias voltage, wherein the generating comprises generating only those of the one or more blocks that specify the device element for the bias voltage that is required during the simulating, wherein the generating comprises:

identifying a first one of the one or more blocks that contains a bias point associated with the bias voltage that is required during the simulating;

creating a spline function in accordance with data contained in the first one of the one or more blocks, when the spline function has not been previously created; and performing a spline evaluation in accordance with the spline function, wherein at least one of: the simulating or the generating is performed using a processor.

2. The method of claim 1, wherein the creating comprises:
obtaining device element data at each vertex of the first one of the one or more blocks; and
producing the spline function in accordance with the device element data obtained at each vertex.

3. The method of claim 2, wherein the device element data is not available at at least one vertex of the first one of the one or more blocks.

4. The method of claim 3, further comprising:
obtaining the device element data at the at least one vertex in accordance with a call to a simulator evaluation function.

5. The method of claim 1, further comprising:
modeling a variation in a threshold voltage or a process variation parameter of the integrated circuit in accordance with the method.

6. The method of claim 5, wherein the one or more blocks specify a characteristic of the integrated circuit at a given value for the variation in the threshold voltage or the process variation parameter.

7. The method of claim 6, wherein the modeling comprises:
deriving the characteristic of the integrated circuit at the given value from a first value for the variation in the threshold voltage or the process variation parameter that is nearest in the lookup table to the given value.

8. The method of claim 7, wherein the deriving the variation in the threshold voltage is further derived from an offset in a gate voltage of the integrated circuit.

9. The method of claim 8, wherein the offset is relative to a nominal threshold voltage device.

10. The method of claim 9, wherein the variation in the threshold voltage is zero for the nominal threshold voltage device.

11. The method of claim 1, wherein the simulating is performed in accordance with a simulation program with integrated circuit emphasis simulator.

12. The method of claim 1, wherein the simulating is performed in accordance with a Berkeley short-channel insulated gate field effect transistor model element evaluation.

13. The method of claim 12, wherein element evaluation calls are generated in accordance with a technology computer aided design simulator.

14. The method of claim 13, wherein the integrated circuit is a partially depleted silicon on insulator device and wherein the method is implemented to compute a virtual body voltage of the integrated circuit that enables the generating of the lookup table for the integrated circuit with a body node of the partially depleted silicon on insulator device as an independent variable.

15. The method of claim 14, further comprising:
selecting a body contact doping material for the integrated circuit in accordance with the virtual body voltage.

16. The method of claim 12, wherein the element evaluation is performed in accordance with a surface-potential based metal-oxide-semiconductor field effect transistor model simulator.

17. The method of claim 12, wherein the element evaluation is performed in accordance with a hardware-based physical model.

18. The method of claim 12, wherein the element evaluation is performed in accordance with a target model.

19. A non-transitory computer readable storage device containing an executable program for statistically evaluating a design of an integrated circuit, where the program performs steps of:
simulating the integrated circuit; and
generating a lookup table for use in the simulating, the lookup table comprising one or more blocks, wherein each of the one or more blocks specifies a device element for an associated bias voltage, wherein the generating comprises generating only those of the one or more blocks that specify the device element for the bias voltage that is required during the simulating, wherein the generating comprises:
identifying a first one of the one or more blocks that contains a bias point associated with the bias voltage that is required during the simulating;
creating a spline function in accordance with data contained in the first one of the one or more blocks, when the spline function has not been previously created; and
performing a spline evaluation in accordance with the spline function.

20. Apparatus for statistically evaluating a design of an integrated circuit, the apparatus comprising:
means for simulating the integrated circuit; and
means for generating a lookup table for use in the simulating, the lookup table comprising one or more blocks, wherein each of the one or more blocks specifies a device element for an associated bias voltage, wherein the generating comprises generating only those of the one or more blocks that specify the device element for the bias voltage that is required during the simulating, wherein the means for generating comprises:
means for identifying a first one of the one or more blocks that contains a bias point associated with the bias voltage that is required during the simulating;
means for creating a spline function in accordance with data contained in the first one of the one or more blocks, when the spline function has not been previously created; and
means for performing a spline evaluation in accordance with the spline function.

* * * * *